United States Patent
Kalamatianos et al.

(10) Patent No.: US 10,379,944 B2
(45) Date of Patent: Aug. 13, 2019

(54) BIT ERROR PROTECTION IN CACHE MEMORIES

(71) Applicant: Advanced Micro Devices, Inc., Sunnyvale, CA (US)

(72) Inventors: John Kalamatianos, Boxborough, MA (US); Shrikanth Ganapathy, Mountain View, CA (US); Steven Raasch, Boston, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 176 days.

(21) Appl. No.: 15/489,438

(22) Filed: Apr. 17, 2017

(65) Prior Publication Data

US 2018/0302105 A1 Oct. 18, 2018

(51) Int. Cl.
*G06F 11/00* (2006.01)
*G06F 11/10* (2006.01)
*G11C 29/42* (2006.01)
*H03M 13/19* (2006.01)

(52) U.S. Cl.
CPC .......... *G06F 11/1064* (2013.01); *G11C 29/42* (2013.01); *H03M 13/19* (2013.01)

(58) Field of Classification Search
CPC .............. H03M 13/1111; H03M 13/611; G11C 11/5642; G11C 11/5628; G11C 16/06
See application file for complete search history.

(56) References Cited

U.S. PATENT DOCUMENTS

| | | | | |
|---|---|---|---|---|
| 6,477,682 B2* | 11/2002 | Cypher | ............... | G06F 11/1028 714/777 |
| 7,409,557 B2* | 8/2008 | Teppler | ..................... | H04L 9/12 713/155 |
| 7,437,597 B1* | 10/2008 | Kruckemyer | ....... | G06F 11/1064 714/6.11 |
| 7,607,071 B2* | 10/2009 | Neefs | ................ | H03M 13/3746 714/785 |
| 7,730,346 B2* | 6/2010 | Kroesche | ............ | G06F 11/1048 714/6.11 |
| 7,996,407 B2* | 8/2011 | Kobayashi | .......... | G06F 17/3071 707/738 |
| 8,095,831 B2* | 1/2012 | Moyer | .................. | G06F 11/073 714/49 |
| 8,145,985 B2* | 3/2012 | Moyer | ................ | G06F 11/1064 714/48 |
| 8,291,305 B2* | 10/2012 | Moyer | ................ | G06F 11/1064 714/799 |

(Continued)

*Primary Examiner* — Esaw T Abraham
(74) *Attorney, Agent, or Firm* — Park, Vaughan, Fleming & Dowler LLP

(57) ABSTRACT

A computing device having a cache memory (or "cache") is described, as is a method for operating the cache. The method for operating the cache includes maintaining, in a history record, a representation of a number of bit errors detected in a portion of the cache. When the history record indicates that no bit errors or a single-bit bit error was detected in the portion of the cache memory, the method includes selecting, based on the history record, an error protection to be used for the portion of the cache memory. When the history record indicates that a multi-bit bit error was detected in the portion of the cache memory, the method includes disabling the portion of the cache memory.

20 Claims, 10 Drawing Sheets

(56) References Cited

U.S. PATENT DOCUMENTS

| | | | | |
|---|---|---|---|---|
| 8,640,005 B2 * | 1/2014 | Wilkerson | .......... | G06F 11/1064 714/763 |
| 8,868,914 B2 * | 10/2014 | Teppler | ................ | H04L 9/3226 713/155 |
| 8,977,820 B2 * | 3/2015 | Penton | ................ | G06F 11/1064 711/118 |
| 9,823,962 B2 * | 11/2017 | Russell | ................ | G06F 11/106 |

* cited by examiner

BIT ERROR PROTECTION IN CACHE MEMORIES

GOVERNMENT RIGHTS

This invention was made with government support under prime contract no. DE-AC52-07NA27344, subcontract no. B609201 awarded by the Department of Energy (DOE). The government has certain rights in this invention.

BACKGROUND

Related Art

Most modern computing devices provide at least one level of cache memory (or "cache") in addition to a main memory in the computing device. Generally, caches are smaller-capacity, faster-access memories that are used for storing a limited number of copies of data and instructions to be used for performing various operations (e.g., computational operations, etc.) nearer to the functional blocks in the computing device that perform the operations. Caches are typically implemented using higher-speed memory circuits, such as static random access memory (SRAM) integrated circuits and other types of memory circuits.

During operation, the memory circuits in a cache consume a significant portion of the overall electrical power consumed by a computing device. Because power consumption is an important concern for computing devices, designers have proposed various techniques for reducing power consumption by the memory circuits in caches. For example, designers have suggested reducing the supply voltage for the memory circuits, which can lead to a noticeable reduction in the power consumption of the memory circuits. Unfortunately, reducing the supply voltage causes the memory circuits to become more susceptible to errors. This is true because reductions in supply voltage are associated with reduced noise margins for the individual memory elements in the memory circuits. In other words, the memory elements in the memory circuits are more susceptible to faults arising from process variation with lower supply voltages. These "low voltage faults" are permanent at a corresponding supply voltage (or, more precisely, at a corresponding supply voltage, frequency, and temperature), in that memory elements experiencing the low-voltage faults will continue to experience the same low-voltage faults as long as the associated supply voltage is used.

BRIEF DESCRIPTION OF THE FIGURES

Throughout the figures and the description, like reference numerals refer to the same figure elements.

DETAILED DESCRIPTION

Figure 1:
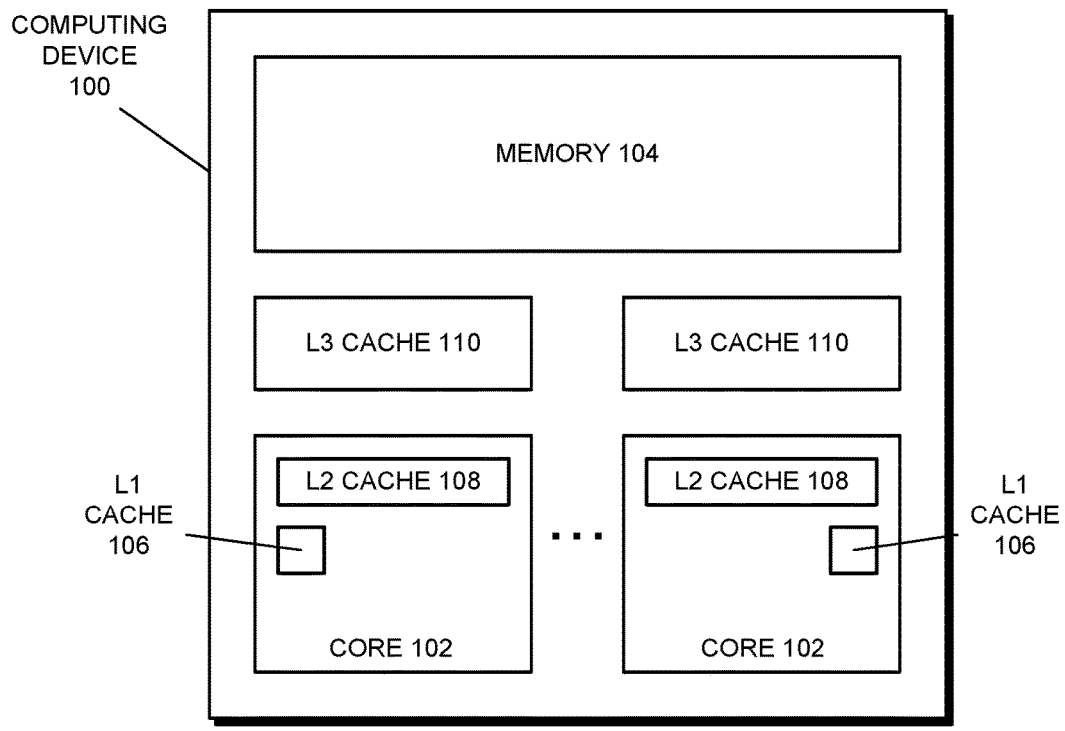
FIG. 1 presents a block diagram illustrating a computing device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Overview

In the described embodiments, a cache memory (or "cache") in a computing device can experience "bit errors." Generally, bit errors occur when accesses to memory elements in the cache are erroneously returning unexpected or undesired values. The described embodiments perform operations for protecting the cache from bit errors.

In order to protect the cache from bit errors, the described embodiments maintain history records associated with portions of the cache, where a "portion" of the cache is a block of memory circuits in the cache of a specified size. For example, in some embodiments, a portion is sufficient to store data for a single cache line (note that, as used herein, "data" is a generic term that covers actual data, instructions, etc.). Each of the history records includes a representation of a number of bit errors detected in the corresponding portion of the cache. For example, each history record may indicate that no bit error, a single-bit bit error, or a multi-bit bit error has been detected in the corresponding portion of the cache. The described embodiments determine, based on each history record, either a type of error protection to be used to safeguard the data in the corresponding portion, or whether to disable the corresponding portion. For example, when no bit error is detected, some embodiments use a parity check as the only error protection. As another example, when a single-bit bit error is detected, some embodiments use an error correction code (ECC) as the error protection. As yet another example, when a multi-bit bit error is detected, some embodiments disable the corresponding portion, i.e., configure the corresponding portion so that the corresponding portion is no longer used for storing data in the cache.

In the described embodiments, the above-described error correction codes are stored in an error correction code cache. In some embodiments, the error correction code cache includes a number of entries for storing error correction codes that is smaller than the number of portions of the cache memory. For example, the error code cache may include a number of entries that is 20% the number of portions in the cache. The entries in the error correction code cache are configurably mapped to portions of the cache in which single-bit bit errors have been detected. In other words, each entry in the error correction code cache is not fixedly associated with a particular portion of the cache memory. By configurably mapping the entries in this way, the described embodiments provide the safeguard of error correction for a subset of the portions of the cache, without requiring the overhead associated with storing error correction codes for all of the portions of the cache.

Using history records to select the type of error protection for portions of caches and to determine portions to be disabled allows the described embodiments to protect caches from bit errors with lower protection overhead than existing techniques. For example, using error correction codes in the error correction code cache only for portions of the cache that are detected as having a single-bit bit error provides the protection of error correction codes, but without requiring that error correction codes be maintained for all of the portions of the cache. In this way, a cache can be reliably operated without paying the cost, in terms of power consumption, circuit area, etc., of maintaining error protection metadata for the entire cache. As another example, the described embodiments avoid the need for other difficult and/or expensive workarounds for avoiding the effect of bit errors (e.g., specially designed memory circuits, etc.). This in turn enables reliable low cost operation for the cache and for a computing device that includes the cache.

Computing Device

FIG. 1 presents a block diagram illustrating a computing device 100 in accordance with some embodiments. As can be seen in FIG. 1, computing device 100 includes two cores 102. Each core 102 is a functional block including one or more computational/processing mechanisms such as central processing units (CPUs), graphics processing units (GPUs), embedded processors, application specific integrated circuits (ASICs), and/or other computational mechanisms that perform computational and/or processing operations in computing device 100.

Computing device 100 includes memory 104. Memory 104 is the "main memory" of computing device 100, and includes memory circuits such as one or more of dynamic random access memory (DRAM), double data rate synchronous DRAM (DDR SDRAM), non-volatile random access memory (NVRAM), and/or other types of memory circuits for storing data and instructions for use by functional blocks in computing device 100, as well as control circuits for handling accesses of the data and instructions that are stored in the memory circuits.

Computing device 100 includes a hierarchy of cache memories (or "caches") that includes an L1 cache 106, L2 cache 108, and L3 cache 110 for each core 102. Each of the L1 cache 106, L2 cache 108, and L3 cache 110 include memory circuits such as static random access memory (SRAM) memory circuits that are used for storing copies of data and instructions, as well as control circuits for handling accesses of the memory circuits. Proceeding in the order L1 cache 106, L2 cache 108, and L3 cache 110, each cache is larger in capacity and is physically located farther from the computational mechanisms that use the data and instructions stored therein—and is therefore slower to access. In other words, the L1 caches 106 can be the smallest of the caches and can be located most closely to the corresponding computational mechanisms, making the L1 caches 106 the fastest to access among the hierarchy of caches.

In some embodiments, some or all of the caches in the hierarchy of caches are configured as write-through caches. In these embodiments, when modified data is written from a core to a write-through cache, the data is immediately written to a next-lower cache in the hierarchy and/or into memory 104. In this way, a correct and current copy of the data in the write though cache is held in a next-lower cache and/or in memory 104. In some embodiments, configuring caches as write-through, by preserving the correct and current copies of data in the lower levels of the hierarchy or memory 104, enables some or all of the operations herein described.

Although embodiments are described with a particular arrangement of cores 102, some embodiments include a different number and/or arrangement of cores, as shown by the ellipsis in FIG. 1. For example, some embodiments have only one core, while other embodiments have five, eight, or another number of cores. Generally, the described embodiments can use any arrangement of cores that can perform the operations herein described.

Although embodiments are described with a particular arrangement of caches, some embodiments include a different number and/or arrangement of caches. For example, some or all of the caches (e.g., L1 cache 106, etc.) may be implemented as separate instruction and data caches. As another example, some embodiments include different levels of caches, from only one level of cache to multiple levels of caches, and some or all of these caches may be located in a core 102 and/or external to the core 102. Generally, the described embodiments can use any arrangement of caches that can perform the operations herein described.

Although computing device 100 is simplified for illustrative purposes, in some embodiments, computing device 100 includes additional or different elements and mechanisms for performing the operations herein described and other operations. For example, computing device 100 can include power subsystems, media processing subsystems, input-output subsystems, communication subsystems, networking subsystems, display subsystems, etc.

Computing device 100 can be, or can be included in, any electronic device that performs computational operations. For example, computing device 100 can be, or can be included in, electronic devices such as desktop computers, laptop computers, wearable computing devices, tablet computers, virtual or augmented reality equipment, smart phones, servers, network appliances, toys, audio-visual equipment, home appliances, controllers, vehicles, etc., and/or combinations thereof.

Cache

Figure 2:
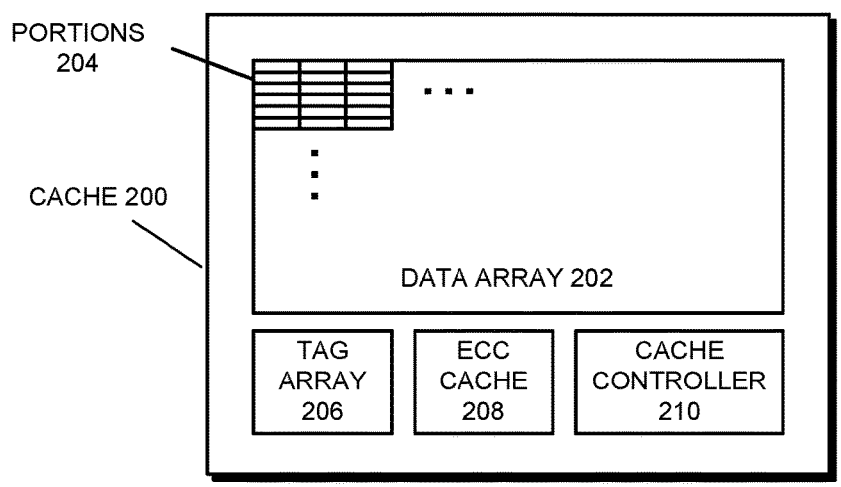
FIG. 2 presents a block diagram illustrating a cache in accordance with some embodiments.

FIG. 2 presents a block diagram illustrating a cache 200 in accordance with some embodiments. In some embodiments, some or all of L1 cache 106, L2 cache 108, and L3 cache 110 are implemented similarly to cache 200, i.e., include the functional blocks shown in FIG. 2.

As can be seen in FIG. 2, cache 200 includes data array 202, tag array 206, error correction code (ECC) cache 208, and cache controller 210. Data array 202 is a functional block that includes memory circuits (e.g., SRAM or another type of memory circuits) that are used for storing data in cache 200 (i.e., for storing data and/or instructions). Data array 202 includes number of portions 204 (only some of which are shown in FIG. 2), each portion 204 including a subset of the memory circuits for storing data for a single cache line (where a cache line is N bytes, N being 64, 128, or another value). In some embodiments, each portion 204 also includes or is associated with information such as metadata (e.g., valid bits, accessed bits, permission bits, etc.).

In some embodiments, along with data, data array 202 (e.g., some or all of the portions 204) is used for storing parity information. Generally, a given piece of parity information includes information (e.g., one or more bits) that is used to detect bit errors in a corresponding data in data array 202. For example, in some embodiments, segmented and interleaved parity is used. For segmented and interleaved parity, data is logically divided into a number of overlapping segments (e.g., four) and parity information is generated for each segment. Using segmented and interleaved parity, multi-bit bit errors can be detected in the data.

Tag array 206 is a functional block that includes memory circuits that are logically divided into a number of entries, each entry configured to store address (or "tag") information that uniquely identifies data stored in a corresponding portion of data array 202, along with a corresponding history record. As data is stored in portions 204 of data array 202, corresponding entries in tag array 206 are updated with address information based on or derived from the addresses for the data. The address information in entries in tag array 206 is then used to determine, based on addresses for subsequently requested data, whether the requested data is present in data array 202.

Figure 3:
FIG. 3 presents a block diagram illustrating an entry in a tag array in accordance with some embodiments.

FIG. 3 presents a block diagram illustrating an entry 300 in tag array 206 in accordance with some embodiments. As can be seen in FIG. 3, entry 300 includes tag 302 and history record 304. Tag 302 is a region or area in entry 300 that is configured to store address information based on or derived from addresses for data stored in a corresponding portion 204 in data array 202. History record 304 is a region or area in entry 300 that is configured to store a representation of a number of bit errors detected in the corresponding portion 204 (i.e., in the bits of an N-byte region for storing data in the corresponding portion 204). For example, in some embodiments, history record 304 is a two-bit value. In these embodiments, a value of 00 indicates that no bit error was/has been detected in the corresponding portion 204, a value of 01 indicates that a single-bit bit error was/has been detected, and a value of 11 indicates that a multi-bit bit error was/has been detected. History record 304 is used to determine an error protection to be used for the corresponding portion 204 or whether the corresponding portion 204 is to be disabled as described herein.

Error correction code (ECC) cache 208 is a functional block that includes memory circuits that are logically divided into a number of entries, each entry configured to store an error correction code. The error correction codes are used to detect and/or correct bit errors in a data stored in portions 204 of data array 202. For example, in some embodiments, the error correction codes are single-error correcting, double-error detecting or SEC-DED codes. Using a SEC-DED code, single-bit bit errors can be corrected and two-bit bit errors can be detected in corresponding data. In some embodiments, ECC cache 208 includes a data array with a number of entries configured to store error correction codes and a tag array configured to store corresponding address information. In these embodiments, the tag array in error correction code cache 208 can be used to search for error correction codes for particular addresses in a similar way to how tag array 206 is used to search for data in portions 204 of data array 202.

In some embodiments, error correction code cache 208 includes a smaller number of entries than there are portions 204 in data array 202. For example, error correction code cache 208 may have a number of entries that is 20% of the number of portions in data array 202. In this case, if there were 500 portions in data array 202, there would be 100 entries in error correction code cache 208. In some of these embodiments, the entries in error correction code cache 208 are not permanently mapped to particular portions 204 of data array 202. Instead, each entry is configurably mapped to any of various portions 204 of data array 202. For example, each entry in error correction code cache 208 is mapped to a single corresponding portion 204 in data array 202 that has been detected to have a single-bit bit error.

In some embodiments, the configurable mapping of the entries in error correction code cache 208 is dynamically updated or changed, i.e., updated at runtime as cache 200 operates. For example, when a transient single-bit bit error is detected in a portion 204 (e.g., due to a soft error such as a cosmic ray fault), an entry in error correction code cache may be assigned or allocated to hold an error correction code for the portion. When the single-bit bit error is subsequently confirmed to no longer be present and the error correction code is thus no longer needed for the portion 204, the entry in error correction code cache 208 may be unassigned, invalidated, etc. The entry can then be assigned to another portion 204 in data array 202 as needed.

Cache controller 210 is a functional block that performs various functions for controlling operations in cache 200. For example, cache controller 210 manages storing data to, invalidating data in, and evicting data from data array 202; performs lookups for data in tag array 206; handles coherency operations for cache 200; and/or responds to requests for data from cache 200. In some embodiments, cache controller 210 performs at least some of the operations for selecting an error protection for or disabling portions 204 in data array 202 based on bit errors as herein described.

Although cache 200 shown in FIG. 2 is simplified for illustrative purposes, in some embodiments, cache 200 includes a different arrangement of functional blocks. Generally, cache 200 includes sufficient functional blocks to perform the operations herein described and other operations performed by caches.

Error Correcting Code

Although embodiments are described herein using SEC-DED error correction codes as an example, in some embodiments, other and/or additional error correcting codes are used. For example, double-error correcting, triple error detecting or DEC-TED codes, triple-error correcting, quadruple error detecting or TEC-QED codes, etc. In these embodiments, the history records and the various operations that use the history records are configured based on the particular variant of error correction code that is used. For example, in an embodiment where a DEC-TED error correcting code and a two-bit history record are used, a value of 01 indicates up to two bit errors have been detected in the corresponding portion, etc. Generally, the described embodiments can use any form of error correction code in the operations herein described.

Low Voltage Faults

In some embodiments, one or more of the caches in computing device 100 (e.g., L1 cache 106, L2 cache 108, and/or L3 cache 110) include mechanisms for adjusting a supply voltage for the cache. For example, in some embodiments, the supply voltage for the memory circuits may be lowered to reduce the amount of electrical power consumed by the memory circuits in the cache. In some of these embodiments, it is possible to lower the supply voltage to a voltage that is low enough to cause low-voltage faults, i.e., to cause the memory circuits to output unexpected or undesired values due to the reduced noise margin caused by the lowered supply voltage (such faults are permanent at a given supply voltage-frequency-temperature combination). To avoid using erroneous data caused by low-voltage faults, which are interchangeably called bit errors, the described embodiments use the herein-described history record to determine an error protection method that is used for portions of the cache, and disable portions of the cache for which error protection is ineffectual.

The mechanisms and operations herein described are not limited to protecting against low-voltage faults. Other faults that affect accesses to memory elements in a data array in a cache, such as failed circuit elements, process faults, thermal faults, etc.,—i.e., that cause the memory elements to experience permanent/repeated faults given particular operating conditions—can be avoided using the mechanisms and operations herein described. These faults may also be called bit errors.

Loading Data from a Cache when No Bit Error is Detected

Figure 4:
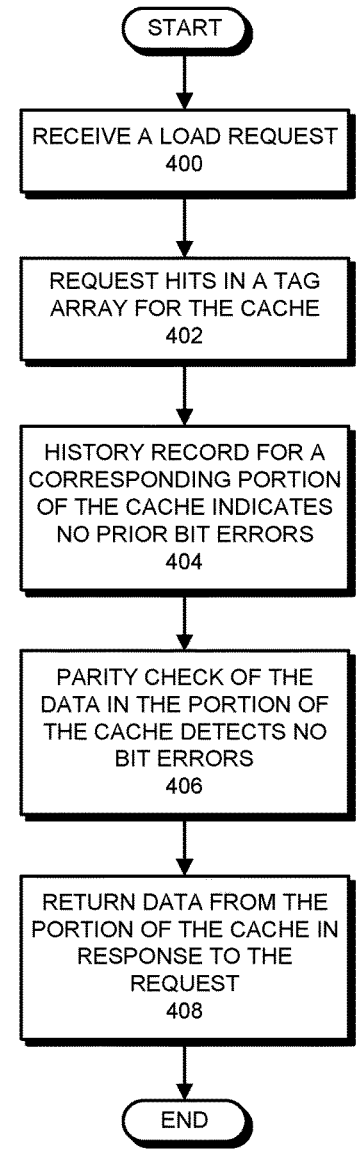
FIG. 4 presents a flowchart illustrating a process for servicing a load request when no bit error is detected in accordance with some embodiments.

As described above, history records, which indicate bit errors previously detected in portions of a cache, are used to determine operations to be performed when servicing load and store requests to the portions of the cache. FIG. 4 presents a flowchart illustrating a process for servicing a load request when no bit error is detected in accordance with some embodiments. In other words, FIG. 4 shows a process for loading data from a portion of a cache that is recorded as having no prior bit error, and for which there is no bit error presently detected. Note that the operations shown in FIG. 4 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 4 starts when the cache (e.g., a cache controller 210 in the cache) receives, from a requesting entity (e.g., a core 102), a load request (step 400). Using an address from the request, the cache checks a tag array to determine if the data is present in the cache. For the example in FIG. 4, it is assumed that the data is present in the cache, so the request hits in the tag array (step 402). In other words, a match for the address from the request is found in the tag array, indicating that the data from the address is present in a corresponding portion of the cache.

The cache then checks a history record for the portion of the cache and determines that the history record indicates no prior bit errors (step 404). For example, in an embodiment where history records are two bits, the history record is acquired from the tag array and determined to be equal to a value such as 00 that indicates that there was no prior bit error detected for the portion of the cache (or at least that the history record has been reset to 00 since a last transient bit error was detected).

Because there is no prior bit error recorded for the portion of the cache, the cache is configured to use a parity check as the error protection method for the portion of the cache. In other words, before using the data from the portion of the cache, the cache is configured to perform an error check using parity information (e.g., one or more parity bits) to ensure that one or more bit errors are not present in the data in the portion of the cache. As described above, in the examples herein, segmented and interleaved parity, which is used to detect multi-bit bit errors in the portion of the cache, is used for performing the parity check—and corresponding parity information is therefore maintained for the portion of the cache. For this example, it is assumed that the parity check of the data in the portion of the cache detects no bit errors (step 406). In other words, the bits of the data in the portion of the cache appear to be correct and in the proper 1/0 state. After confirming that there are no bit errors, the cache returns the data from the portion of the cache in response to the request (step 408).

During the process in FIG. 4, to summarize, no bit error is detected in a portion of the cache that was previously marked as having no bit error. The history record for the portion of the cache, which indicates no bit error (e.g., is set to 00) is unchanged during this process, i.e., left indicating no bit error. In addition, the parity information is unchanged. The parity check is therefore left as the error protection method to be used for data stored in the portion of the cache.

Loading Data from a Cache when a Single-Bit Bit Error is Detected

Figure 5:
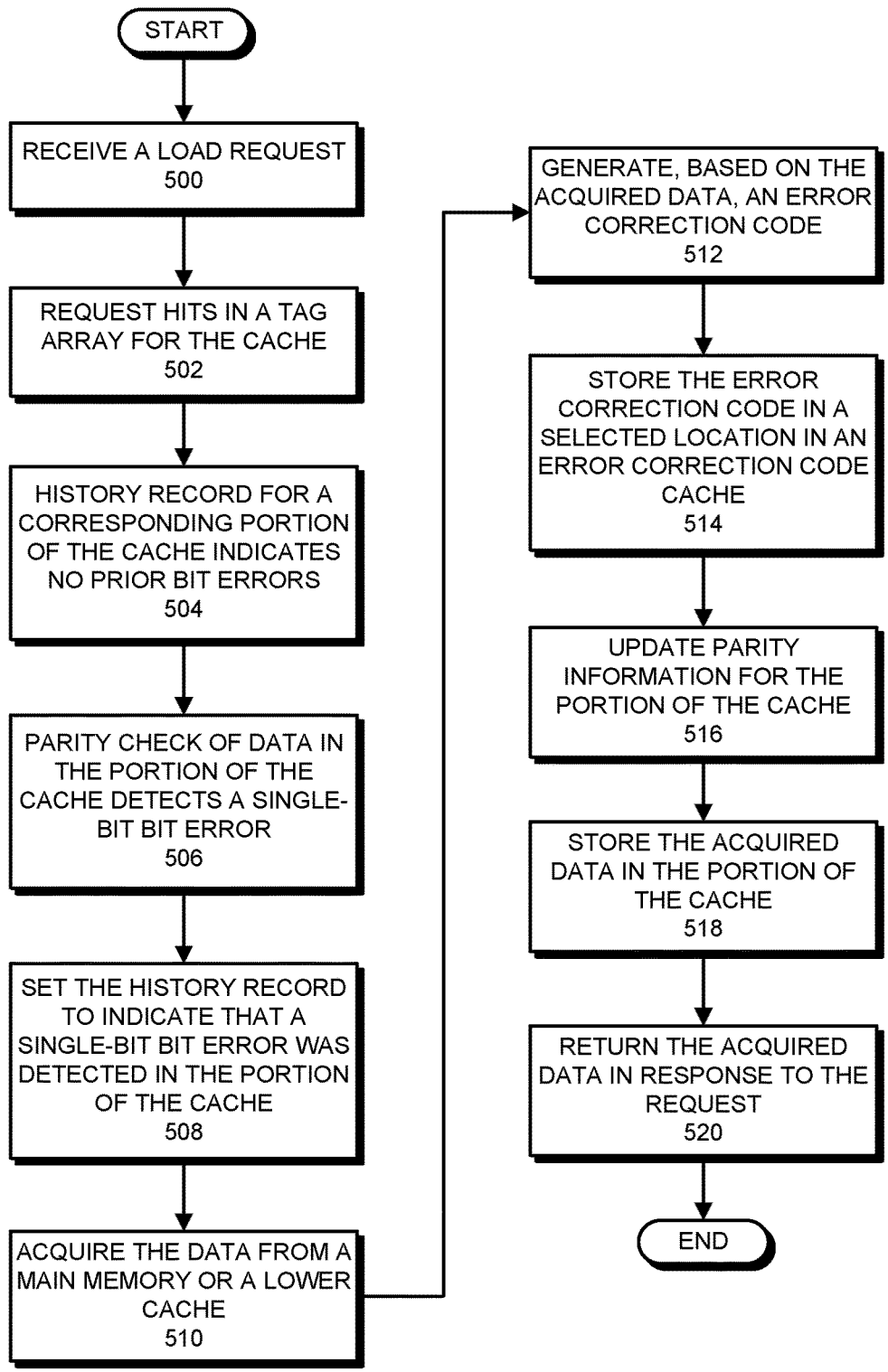
FIG. 5 presents a flowchart illustrating a process for servicing a load request when a single-bit bit error is detected in accordance with some embodiments.

FIG. 5 presents a flowchart illustrating a process for servicing a load request when a single-bit bit error is detected in accordance with some embodiments. In other words, FIG. 5 shows a process for loading data from a portion of a cache that is recorded as having no prior bit error, but for which there is a single-bit bit error presently detected. Note that the operations shown in FIG. 5 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 5 starts when the cache (e.g., a cache controller 210 in the cache) receives, from a requesting entity (e.g., a core 102), a load request (step 500). Using an address from the request, the cache checks a tag array to determine if the data is present in the cache. For the example in FIG. 5, it is assumed that the data is present in the cache, so the request hits in the tag array (step 502). In other words, a match for the address from the request is found in the tag array, indicating that the data from the address is present in a corresponding portion of the cache.

The cache then checks a history record for the portion of the cache and determines that the history record indicates no prior bit errors (step 504). For example, in an embodiment where history records are two bits, the history record is acquired from the tag array and determined to be equal to a value such as 00 that indicates that there was no prior bit error detected for the portion of the cache (or at least that the history record has been reset to 00 since a last transient bit error was detected).

Because there is no prior bit error recorded for the portion of the cache, and thus the portion of the cache is assumed not to have bit errors, the cache is configured to use a parity check as the error protection method for the portion of the cache. In other words, before using the data from the portion of the cache, the cache is configured to perform an error check using parity information (e.g., one or more parity bits) to ensure that one or more bit errors are not present in the data in the portion of the cache. As described above, in the examples herein, segmented and interleaved parity, which is used to detect multi-bit bit errors in the data in the portion of the cache, is used for performing the parity check—and corresponding parity information is therefore maintained for the portion of the cache. For this example, it is assumed that the parity check of the data in the portion of the cache detects a single-bit bit error (step 506). In other words, one of the bits of the data in the portion of the cache is in an improper state, i.e., a 1 is located where a 0 should be located or vise versa.

Because the parity check only detects errors, and does not correct them, the data in the portion of the cache is simply known to be incorrect and unusable. For this reason, the cache performs various operations to reload the data from memory and configure the error protection method to be error correction (with the view that the bit error is permanent and will reoccur). More specifically, the cache sets the history record for the portion of the cache to indicate that a single-bit bit error was detected in the portion of the cache (step 508). Continuing the example above of the two bit history record, this means that the cache sets the history record to a value such as 01 that indicates that a single-bit bit error was detected in the portion of the cache. By setting the history record as described, the cache configures the portion of the cache so that error correction is used as the error protection method (and not simply the parity check). As described above, the error correction used in the examples herein is a single error correct, double error detect (SEC-DED) error correction.

The cache then acquires the data from main memory or a lower cache (step 510). For example, the cache signals a cache miss for the data (despite actually having the incorrect copy located in the portion of the cache), which causes the computing device to acquire the data from the main memory or the lower level cache.

The cache, upon acquiring the data from the main memory or lower level cache, generates, based on the data, an error correction code for the data (step 512). During this operation, an error correction code is generated in accordance with the requirements of the SEC-DED error correction. The cache next stores the generated error correction code in a selected location in the error correction code cache (step 514). As described above, the entries in the error correction code cache are not permanently mapped to particular portions of the cache and so step 514 includes selecting a location within the error correction code cache for storing the generated error correction code as well as writing the error correction code (and possibly metadata such as valid bits, etc.) to the selected location.

In some embodiments, when there is no free/available entry in the error correction code cache, an existing error correction code is chosen for eviction from a selected location in accordance with a replacement policy for the error correction code cache to free space for storing the generated error correction code. For example, a least recently used policy is the replacement policy. In some embodiments, when an existing error correction code is evicted as described, the data in a corresponding portion of the cache is also evicted (or otherwise invalidated). In other words, the data in the portion of the cache that is protected by the evicted error correction code is also evicted from the cache when the error correction code is evicted. This is done because the error correction code that protected the data in the corresponding portion of the cache has been evicted and therefore there is no protection for the data in the portion of the cache. In addition, evicting the data from the portion of the cache frees the portion of the cache to store other data.

The cache next updates parity information for the portion of the cache (step 516). During this operation, the cache generates, based on the acquired data, parity information. For example, for the above-described segmented and interleaved parity, the cache generates parity bits for corresponding segments of the data. The cache then stores the parity information in the portion of the cache. For example, a number of parity bits is associated with the portion of the cache and the parity information is stored thereto. By updating the parity information for the portion of the cache as described, parity checks are enabled for the data in the portion of the cache.

The cache then stores the acquired data in the portion of the cache (step 518). The data is stored in the portion despite there being a possibility of a permanent or repeating single-bit bit error that affects a bit in the portion of the cache. This is acceptable because the error correction code was previously generated and stored for the data, meaning that a single-bit bit error can be corrected. Note, however, that the single-bit bit error may be temporary, such as when a soft error causes a one-time bit change in the portion of the cache. As described below, when the single-bit bit error is discovered to have dissipated, the history record is updated and the error protection method for the portion of the cache is configured to be a parity check. The cache then returns the acquired data in response to the request (step 518).

During the process in FIG. 5, to summarize, a single-bit bit error is detected in a portion of the cache that was previously marked as having no bit error. In response, the cache updates the history record to indicate that the single-bit bit error was detected and prepares to use error correction as the error protection method for subsequent accesses of the portion of the cache.

Loading Data from a Cache when a Multi-Bit Bit Error is Detected

Figure 6:
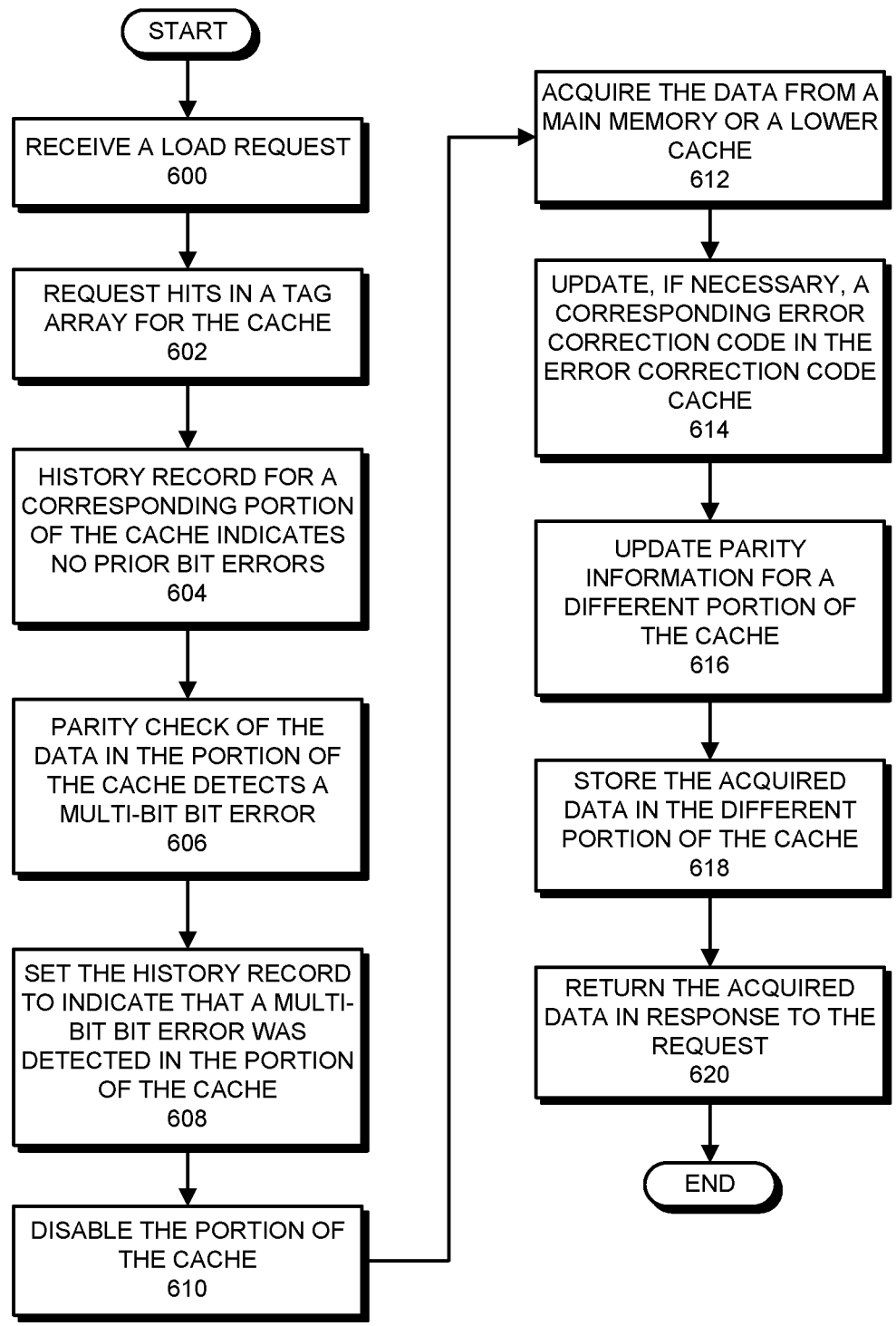
FIG. 6 presents a flowchart illustrating a process for servicing a load request when a multi-bit bit error is detected in accordance with some embodiments.

FIG. 6 presents a flowchart illustrating a process for servicing a load request when a multi-bit bit error is detected in accordance with some embodiments. In other words, FIG. 6 shows a process for loading data from a portion of a cache that is recorded as having no prior bit error, but for which there is a multi-bit bit error presently detected. Note that the operations shown in FIG. 6 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 6 starts when the cache (e.g., a cache controller 210 in the cache) receives, from a requesting entity (e.g., a core 102), a load request (step 600). Using an address from the request, the cache checks a tag array to determine if the data is present in the cache. For the example in FIG. 6, it is assumed that the data is present in the cache, so the request hits in the tag array (step 602). In other words, a match for the address from the request is found in the tag array, indicating that the data from the address is present in a corresponding portion of the cache.

The cache then checks a history record for the portion of the cache and determines that the history record indicates no prior bit errors (step 604). For example, in an embodiment where history records are two bits, the history record is acquired from the tag array and determined to be equal to a value such as 00 that indicates that there was no prior bit error detected for the portion of the cache (or at least that the history record has been reset to 00 since a last transient bit error was detected).

Because there is no prior bit error recorded for the portion of the cache (and thus the portion of the cache is assumed not to have bit errors), the cache is configured to use a parity check as the error protection method for the portion of the cache. In other words, before using the data from the portion of the cache, the cache is configured to perform an error check using parity information (e.g., one or more parity bits) to ensure that one or more bit errors are not present in the data in the portion of the cache. As described above, in the examples herein, segmented and interleaved parity, which is used to detect multi-bit bit errors in the data in the portion of the cache, is used for performing the parity check—and corresponding parity information is therefore maintained for the portion of the cache. For this example it is assumed that the parity check of the data in the portion of the cache detects a multi-bit bit error (step 606). In other words, two or more of the bits of the data in the portion of the cache are in an improper state, i.e., 1/0s are located where 0/1s should be located. The cache then sets the history record for the portion of the cache to indicate that a multi-bit bit error was detected (step 608). Continuing the example above of the two bit history record, this means that the cache sets the history record to a value such as 11 that indicates that a multi-bit bit error was detected in the portion of the cache.

Because the parity check only detects errors, and does not correct them, the data in the portion of the cache is simply known to be incorrect and unusable. It is further known that the SEC-DED error correction codes generally cannot be used to correct multi-bit bit errors, and thus would not work to correct the multi-bit bit error detected in the portion of the cache. In other words, the solution to the single-bit bit error based on the error correcting code described above for FIG. 5 is not usable for the multi-bit bit error in FIG. 6. Because the cache has no mechanism other than the error correction code to correct the bit errors, the cache disables the portion of the cache (step 610). For example, in some embodiments, a replacement policy used by the cache is configured so that any portion of the cache with a history record that indicates a multi-bit bit error is not selected or otherwise allocated for storing data. In these embodiments, the portion of the cache is "disabled" by not being selected for storing data, although the corresponding memory circuits may remain electrically powered and available for other operations. As another example, in some embodiments, the cache sets a disabled bit in the corresponding location in the tag array so that no tag is permitted to be stored in the corresponding location in the tag array, sets a disabled bit in the portion of the cache, adds an identifier for the portion of the cache to a disabled list, and/or performs other operations to ensure that the portion of the cache is not subsequently used for storing data. By disabling the portion of the cache as described, the cache removes the portion of the cache, now known to include a multi-bit bit error, from use within the cache.

The cache then acquires the data from main memory or a lower cache (step 612). For example, the cache signals a cache miss for the data (despite actually having the incorrect copy located in the portion of the cache), which causes the computing device to acquire the cache from the main memory or the lower level cache.

If necessary, the cache updates a corresponding error correction code in the error correction code cache (step 614). For example, the cache selects a different portion of the cache to which the data is to be stored and updates the corresponding error correction code when the history record for the different portion indicates that a prior single-bit bit error was detected for the different portion. As described herein, this operation involves the cache generating an error correction code based on the data and storing the error correction code in the error correction code cache.

The cache then updates parity information for the different portion of the cache (step 616). During this operation, the cache generates, based on the acquired data, parity information. For example, for the above-described segmented and interleaved parity, the cache generates parity bits for corresponding segments of the data. The cache then stores the parity information in the portion of the cache. For example, a number of parity bits is associated with the portion of the cache and the parity information is stored thereto. By updating the parity information for the portion of the cache as described, parity checks are enabled for the data in the portion of the cache.

The cache next stores the acquired data in the different portion of the cache (step 618). Generally, the different portion of the cache is a portion of the cache other than the portion of the cache in which the multi-bit bit error was detected. For example, the different portion of the cache may be a different way in a set for an associative cache, etc. and may be selected in accordance with a replacement policy. The cache also returns the acquired data in response to the request (step 620).

During the process in FIG. 6, to summarize, a multi-bit bit error is detected in a portion of the cache that was previously marked as having no bit error. In response, the cache updates the history record to indicate that the multi-bit bit error was detected in the portion and removes the portion from use. Note that portions of the cache removed as described may subsequently be verified and returned to use, for example, if one or more bits of the multi-bit bit error were due to a transient error such as a soft error.

Figure 7:
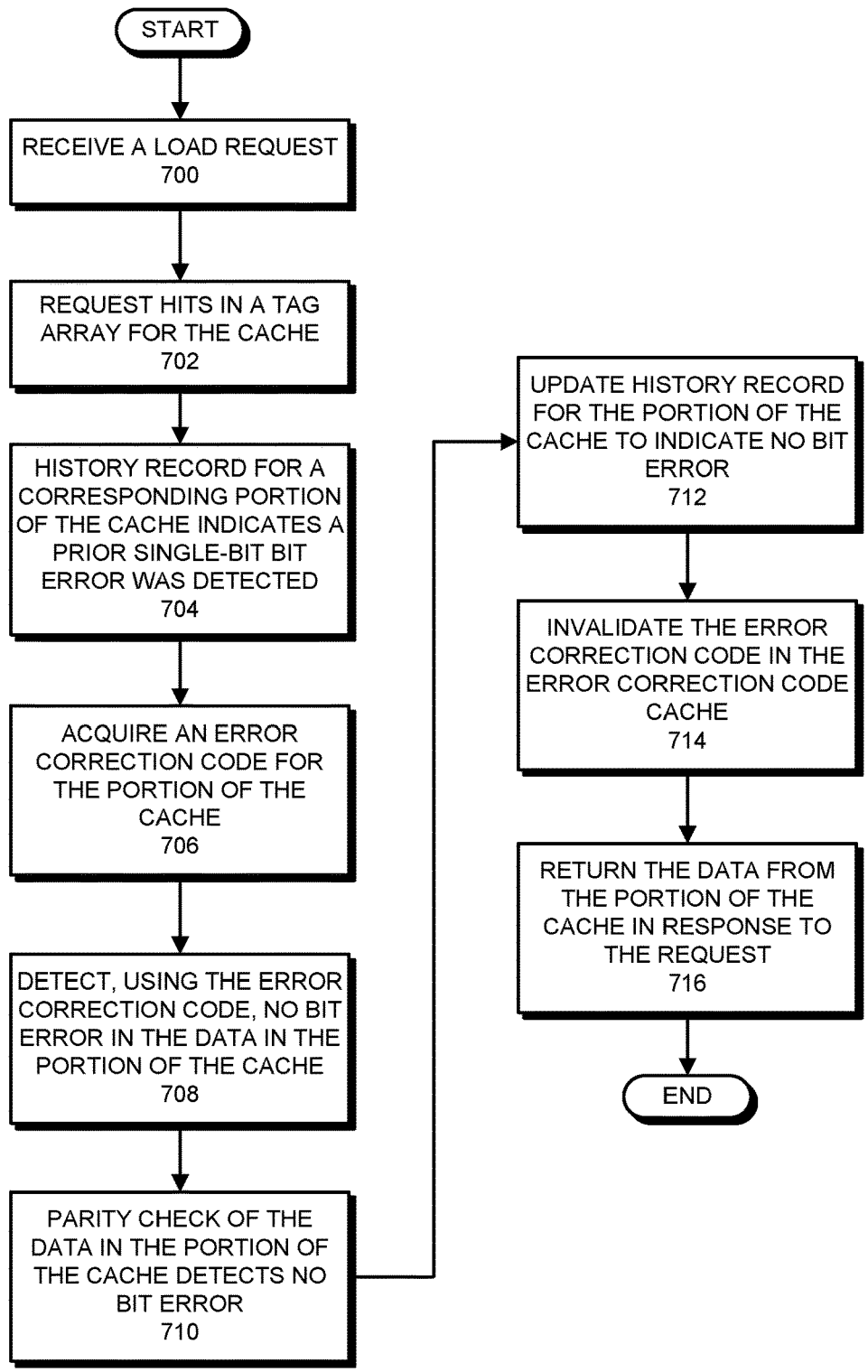
FIG. 7 presents a flowchart illustrating a process for servicing a load request when a prior single-bit bit error was detected and no bit errors are presently detected in accordance with some embodiments.

Loading Data from a Cache when a Prior Single-Bit Bit Error was Detected and No Bit Errors are Presently Detected FIG. 7 presents a flowchart illustrating a process for servicing a load request when a prior single-bit bit error was detected and no bit errors are presently detected in accordance with some embodiments. Note that the operations shown in FIG. 7 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 7 starts when the cache (e.g., a cache controller 210 in the cache) receives, from a requesting entity (e.g., a core 102), a load request (step 700). Using an address from the request, the cache checks a tag array to determine if the data is present in the cache. For the example in FIG. 7, it is assumed that the data is present in the cache, so the request hits in the tag array (step 702). In other words, a match for the address from the request is found in the tag array, indicating that the data from the address is present in a corresponding portion of the cache.

The cache then checks a history record for the portion of the cache and determines that the history record indicates that a prior single-bit error was detected for the portion of the cache (step 704). For example, in an embodiment where history records are two bits, the history record is acquired from the tag array and determined to be equal to a value such as 01 that indicates that there was a prior single-bit bit error detected for the portion of the cache.

Because there was a prior single-bit bit error detected for the portion of the cache, the cache is configured to use error correction as the error protection method for the portion of the cache. In other words, before using the data from the portion of the cache, the cache is configured to use an error correction code to detect and correct, if possible, bit errors in the data in the portion of the cache. As described above, in the examples herein, a single error correct double error detect, or SEC-DED, error correction code is used. Generally, the error correction codes are stored in allocated entries in an error correction code cache (e.g., error correction code cache 208). The cache therefore acquires, from an entry in the error correction code cache that is associated with the portion of the cache, a corresponding error correction code (step 706). For example, the cache performs a tag lookup in a tag array in the error correction code cache using an address or other identifier for the portion, the data, etc. and, based on a hit in the tag array, acquires the error correction code from an error correction code array in the error correction code cache.

Upon checking the portion of the cache using the error correction code, the cache detects no bit error in the data in the portion of the cache (step 708). For example, a previously detected transient error such as a soft error caused by a cosmic ray may have been overwritten in the portion of the cache and so the data may be correct, despite earlier data in the portion having had a bit error. In other words, despite the history record indicating the portion of the cache as having a single-bit bit error, there may presently be no bit error that is detectable using the error correction code—and there may be no bit error at all.

To ensure that there is no error in the data in the portion of the cache, i.e., that the error is not such that it is undetectable using the error correction code, the cache also performs a parity check for the data. The parity check includes using parity information (e.g., one or more parity bits) to ensure that one or more bit errors are not present in the data. For this example it is assumed that the parity check of the data in the portion of the cache detects no bit errors (step 710). In other words, the bits of the data in the portion of the cache appear to be correct and in the proper 1/0 state.

After confirming that there are no bit errors via the error correction code and parity check, the cache updates the history record for the portion of the cache to indicate that no bit error was detected (step 712). By updating the history record as described, the cache configures the error protection method for the portion of the cache to be a simpler parity check due to the lack of a bit error in the portion of the cache. The cache then invalidates the corresponding error correction code in the error correction code cache (step 714). By invalidating the error correction code, the cache frees an entry of the error correction code cache to be subsequently used for holding an error correction code for another portion of the cache that has a single-bit bit error. The cache then returns the data from the portion of the cache in response to the request (step 716).

During the process in FIG. 7, to summarize, a single-bit error that was previously detected in the portion of the cache is not presently detected in the portion of the cache using either the error correction code or the parity check. The portion of the cache is therefore marked as having no bit error for subsequent accesses.

Figure 8:
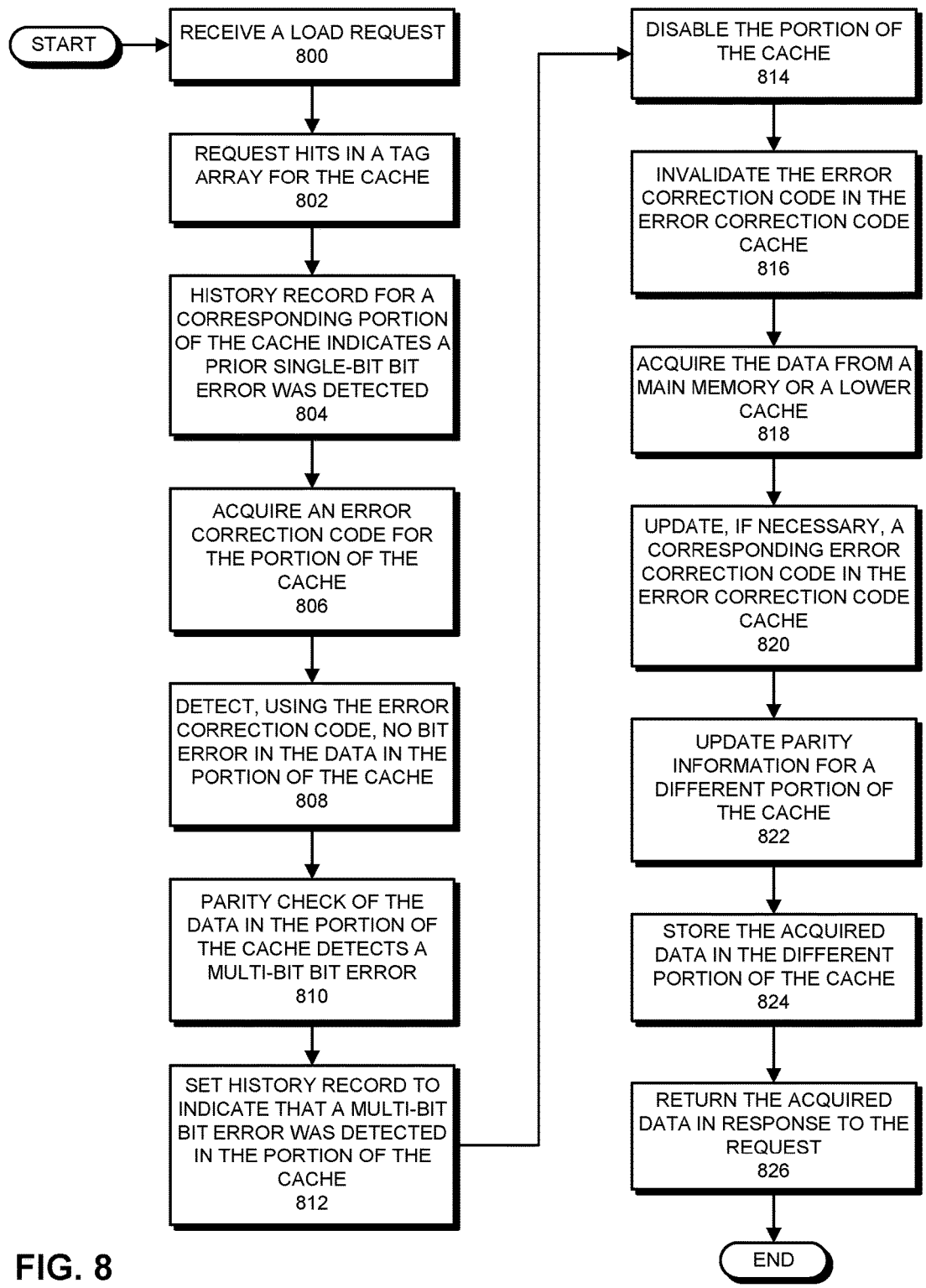
FIG. 8 presents a flowchart illustrating a process for servicing a load request when a prior single-bit bit error was detected and a bit error that is presently undetected using an error correction code is detected using a parity check in accordance with some embodiments.

Loading a Data from a Cache when a Prior Single-Bit Bit Error was Detected and a Bit Error that is Presently Undetected Using an Error Correction Code is Detected Using a Parity Check FIG. 8 presents a flowchart illustrating a process for servicing a load request when a prior single-bit bit error was detected and a bit error that is presently undetected using an error correction code is detected using a parity check in accordance with some embodiments. In other words, FIG. 8 shows a process for loading data from a portion of a cache that is recorded as having a prior single-bit error. Note that the operations shown in FIG. 8 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 8 starts when the cache (e.g., a cache controller 210 in the cache) receives, from a requesting entity (e.g., a core 102), a load request (step 800). Using an address from the request, the cache checks a tag array to determine if the data is present in the cache. For the example in FIG. 8, it is assumed that the data is present in the cache, so the request hits in the tag array (step 802). In other words, a match for the address from the request is found in the tag array, indicating that the data from the address is present in a corresponding portion of the cache.

The cache then checks a history record for the portion of the cache and determines that the history record indicates that a prior single-bit error was detected for the portion of the cache (step 804). For example, in an embodiment where history records are two bits, the history record is acquired from the tag array and determined to be equal to a value such as 01 that indicates that there was a prior single-bit bit error detected for the portion of the cache.

Because there was a prior single-bit bit error detected for the portion of the cache, the cache is configured to use error correction as the error protection method for the portion of the cache. In other words, before using the data from the portion of the cache, the cache is configured to use an error correction code to detect and correct, if possible, bit errors in the data in the portion of the cache. As described above, in the examples herein, a single error correct double error detect, or SEC-DED, error correction code is used. Generally, the error correction codes are stored in allocated entries in an error correction code cache (e.g., error correction code cache 208). The cache therefore acquires, from an entry in the error correction code cache that is associated with the portion of the cache, a corresponding error correction code (step 806). For example, the cache performs a tag lookup in a tag array in the error correction code cache using an address or other identifier for the portion, the data, etc. and, based on a hit in the tag array, acquires the error correction code from an error correction code array in the error correction code cache.

Upon checking the portion of the cache using the error correction code, the cache detects no bit error in the data in the portion of the cache (step 808). For example, a previously detected transient error such as a soft error caused by a cosmic ray may have been overwritten in the portion of the cache and so the data may be correct (despite earlier data in the portion having had a bit error). In other words, despite the history record indicating the portion of the cache as having a single-bit bit error, there may presently be no bit error that is detectable using the error correction code—and there may be no bit error at all.

To ensure that there is no error in the data in the portion of the cache, i.e., that the error is not such that it is undetectable using the error correction code, the cache also performs a parity check for the data. The parity check includes using parity information (e.g., one or more parity bits) to ensure that one or more bit errors are not present in the data. For this example it is assumed that the parity check of the data in the portion of the cache detects a multi-bit bit error (step 810). In other words, the bits of the data in the portion of the cache appear to be incorrect, despite the earlier error-free result of the check using the error correction code in step 808. For example, repeating and/or permanent errors such as errors caused by operating the cache at a reduced supply voltage may occur in the portion of the cache memory (i.e., in a corresponding memory element). Such errors can repeatedly and/or permanently occur in the same bit locations in the portion of the cache memory unless the supply voltage is increased. As another example, soft or transient errors may occur in the portion of the cache memory.

Because the parity check failed, the cache performs operations for preventing the portion of the cache from being used for storing data. More specifically, the cache sets the history record for the portion of the cache to indicate that a multi-bit bit error was detected (step 812). The cache also disables the portion of the cache (step 814). For example, in some embodiments, a replacement policy used by the cache is configured so that any portion of the cache with a history record that indicates a multi-bit bit error is not selected or otherwise allocated for storing data. In these embodiments, the portion of the cache is "disabled" by not being selected for storing data, although the corresponding memory circuits may remain electrically powered and available for other operations. As another example, in some embodiments, the cache sets a disabled bit in the corresponding location in the tag array so that no tag is permitted to be stored in the corresponding location in the tag array, sets a disabled bit in the portion of the cache, adds an identifier for the portion of the cache to a disabled list, and/or performs other operations to ensure that the portion of the cache is not subsequently used for storing data. By disabling the portion of the cache as described, the cache removes the portion of the cache, now known to include a multi-bit error that is undetectable/uncorrectable using the error correction code, from use within the cache. The cache further invalidates a corresponding error correction code in the error correction code cache (step 816). This operation frees an entry that may have been occupied in the error correction code cache.

The cache then acquires the data from main memory or a lower cache (step 818). For example, the cache signals a cache miss for the data (despite actually having the incorrect copy located in the portion of the cache), which causes the computing device to acquire the cache from the main memory or the lower level cache.

If necessary, the cache updates a corresponding error correction code in the error correction code cache (step 820). For example, the cache selects a different portion of the cache to which the data is to be stored and updates the corresponding error correction code when the history record for the different portion indicates that a prior single-bit bit error was detected for the different portion. As described herein, this operation involves the cache generating an error correction code based on the data and storing the error correction code in the error correction code cache.

The cache then updates parity information for the different portion of the cache (step 822). During this operation, the cache generates, based on the acquired data, parity information. For example, for the above-described segmented and interleaved parity, the cache generates parity bits for corresponding segments of the data. The cache then stores the parity information in the portion of the cache. For example, a number of parity bits is associated with the portion of the cache and the parity information is stored thereto. By updating the parity information for the portion of the cache as described, parity checks are enabled for the data in the portion of the cache.

The cache then stores the acquired data in the different portion of the cache (step 824). Generally, the different portion of the cache is a portion of the cache other than the portion of the cache in which the bit error was detected during the parity check. For example, the different portion of the cache may be a different way in a set for an associative cache, etc. The cache then returns the acquired data in response to the request (step 826).

During the process in FIG. 8, to summarize, a single-bit error that was previously detected in the portion of the cache is not presently detected in the portion of the cache using the error correction code, but a parity check fails. In response, the cache updates the history record to indicate that the multi-bit bit error was detected in the portion and removes the portion from use. Note that portions of the cache removed as described may subsequently be verified and returned to use, for example, if one or more bits of the multi-bit bit error were due to a transient error such as a soft error.

Figure 9:
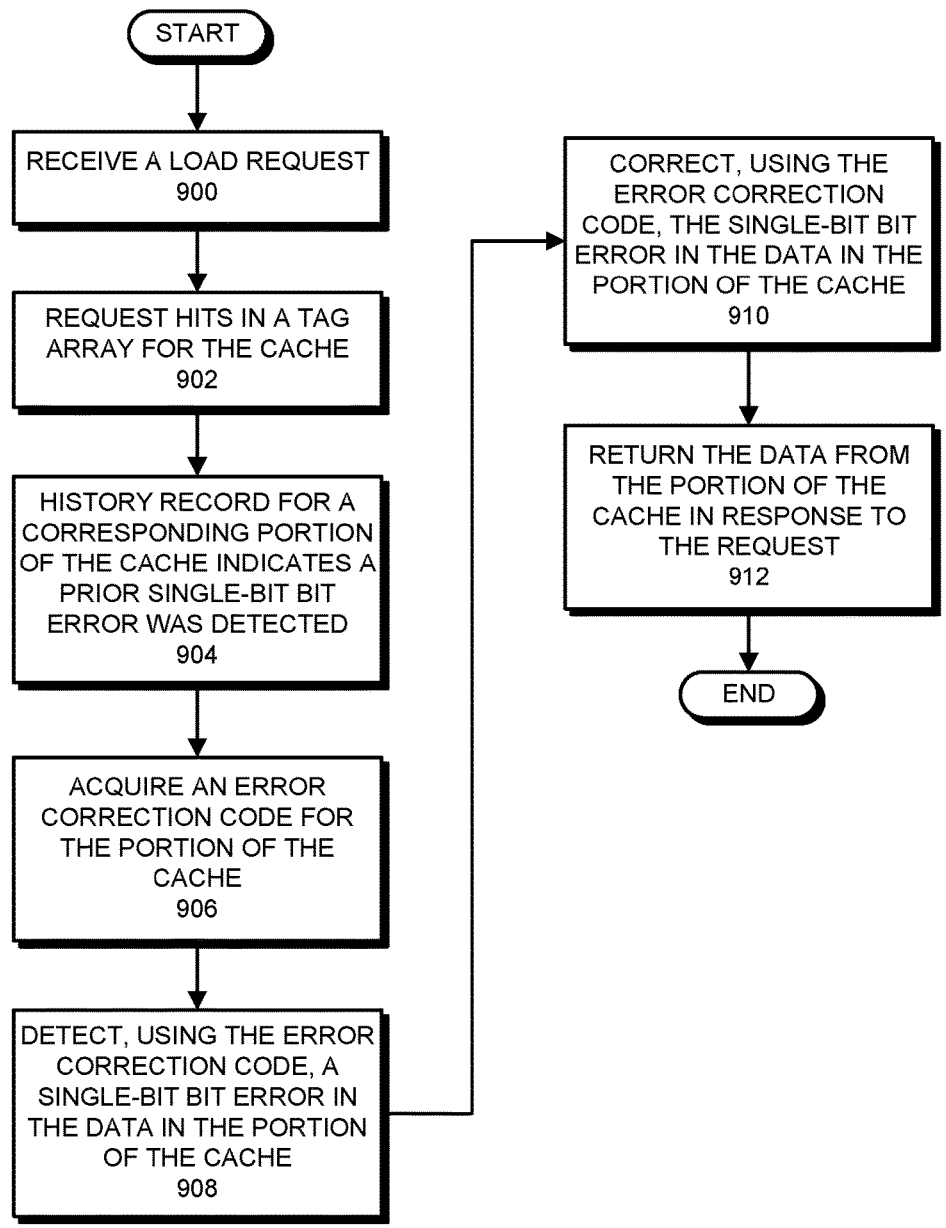
FIG. 9 presents a flowchart illustrating a process for servicing a load request when a prior single-bit bit error was detected and a single-bit error is presently detected and corrected using an error correction code in accordance with some embodiments.

Loading a Data from a Cache when a Prior Single-Bit Bit Error was Detected and a Single-Bit Error is Presently Detected and Corrected Using an Error Correction Code FIG. 9 presents a flowchart illustrating a process for servicing a load request when a prior single-bit bit error was detected and a single-bit error is presently detected and corrected using an error correction code in accordance with some embodiments. In other words, FIG. 9 shows a process for loading data from a portion of a cache that is recorded as having a prior single-bit error. Differently than the process shown in FIG. 7 in which there was no bit error presently detected in the data in the portion of the cache, in FIG. 9, a correctable single-bit error is presently detected. Note that the operations shown in FIG. 9 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 9 starts when the cache (e.g., a cache controller 210 in the cache) receives, from a requesting entity (e.g., a core 102), a load request (step 900). Using an address from the request, the cache checks a tag array to determine if the data is present in the cache. For the example in FIG. 9, it is assumed that the data is present in the cache, so the request hits in the tag array (step 902). In other words, a match for the address from the request is found in the tag array, indicating that the data from the address is present in a corresponding portion of the cache.

The cache then checks a history record for the portion of the cache and determines that the history record indicates that a prior single-bit error was detected for the portion of the cache (step 904). For example, in an embodiment where history records are two bits, the history record is acquired from the tag array and determined to be equal to a value such as 01 that indicates that there was a prior single-bit bit error detected for the portion of the cache.

Because there was a prior single-bit bit error detected for the portion of the cache, the cache is configured to use error correction as the error protection method for the portion of the cache. In other words, before using the data from the portion of the cache, the cache is configured to use an error correction code to detect and correct, if possible, bit errors in the data in the portion of the cache. As described above, in the examples herein, a single error correct double error detect, or SEC-DED, error correction code is used. Generally, the error correction codes are stored in allocated entries in an error correction code cache (e.g., error correction code cache 208). The cache therefore acquires, from an entry in the error correction code cache that is associated with the portion of the cache, a corresponding error correction code (step 906). For example, the cache performs a tag lookup in a tag array in the error correction code cache using an address or other identifier for the portion, the data, etc. and, based on a hit in the tag array, acquires the error correction code from an error correction code array in the error correction code cache.

Upon checking the data in the portion of the cache using the error correction code, the cache detects a single-bit bit error in the data (step 908). For example, a repeating and/or permanent error such as an error caused by operating the cache at a reduced supply voltage may occur in a corresponding SRAM memory element. Such an error can repeatedly and/or permanently occur in a same bit location in the portion of the cache memory unless the supply voltage is increased. The cache applies the error correction code to the data from the portion of the cache and corrects the single-bit bit error (step 910). The cache then returns the data from the portion of the cache in response to the request (step 912).

During the process in FIG. 9, to summarize, a single-bit error was previously detected in the portion of the cache and is presently detected in the data in the portion of the cache using an error correction code. The single-bit bit error in the data in the portion of the cache is corrected using the error correction code and the corrected data is returned to the requesting entity. In other words, the SEC-DED error correction code functions as desired with regard to correcting the single-bit bit error.

Figure 10:
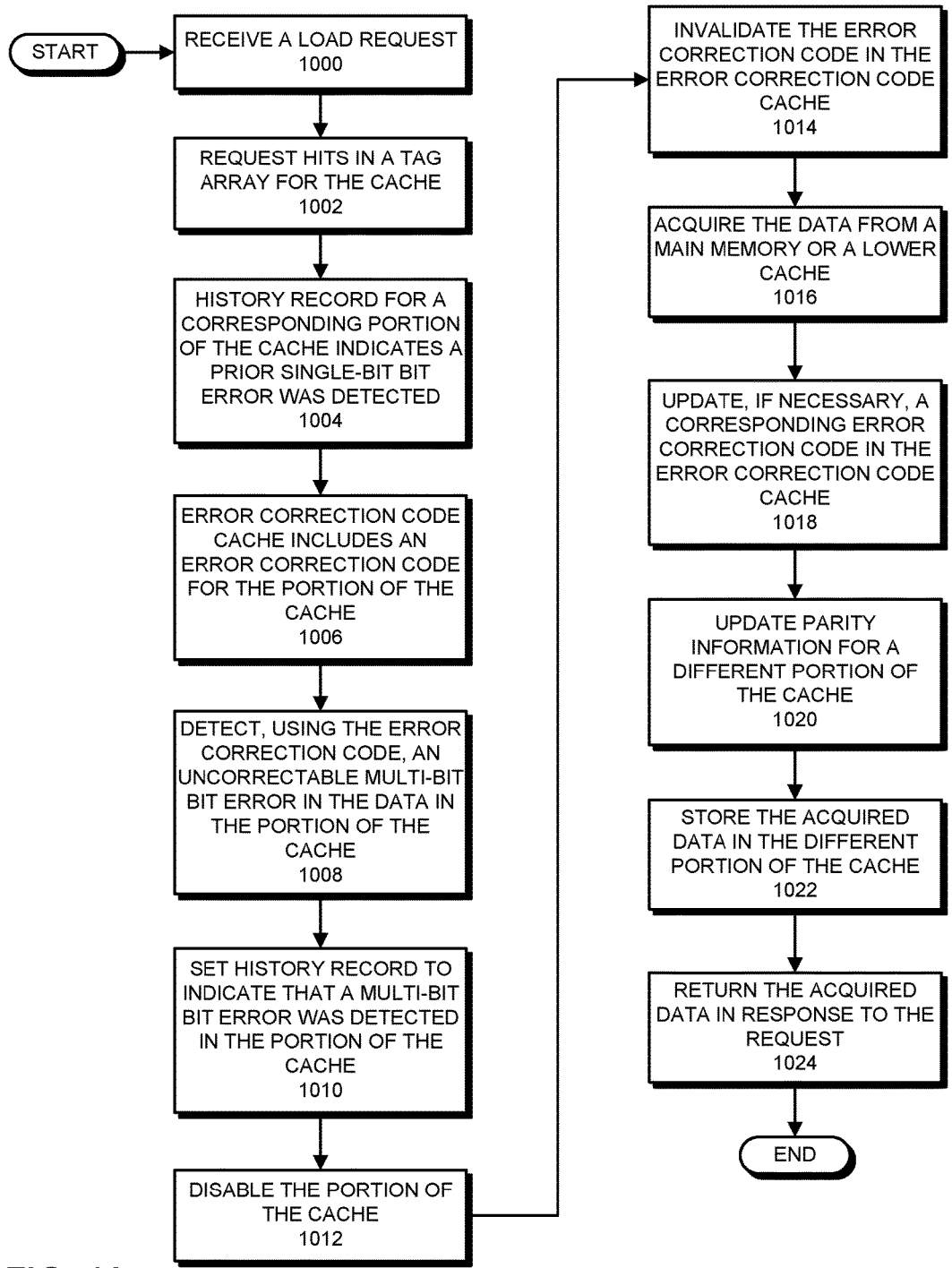
FIG. 10 presents a flowchart illustrating a process for servicing a load request when a prior single-bit bit error was detected and a multi-bit bit error is presently detected in accordance with some embodiments.

Loading a Data from a Cache when a Prior Single-Bit Bit Error was Detected and a Multi-Bit Bit Error is Presently Detected FIG. 10 presents a flowchart illustrating a process for servicing a load request when a prior single-bit bit error was detected and a multi-bit bit error is presently detected in accordance with some embodiments. In other words, FIG. 10 shows a process for loading data from a portion of a cache that is recorded as having a prior single-bit error. Differently than the process shown in FIG. 9, in which a correctable single-bit error is presently detected, in FIG. 10, an uncorrectable multi-bit bit error is presently detected. Note that the operations shown in FIG. 10 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 10 starts when the cache (e.g., a cache controller 210 in the cache) receives, from a requesting entity (e.g., a core 102), a load request (step 1000). Using an address from the request, the cache checks a tag array to determine if the data is present in the cache. For the example in FIG. 10, it is assumed that the data is present in the cache, so the request hits in the tag array (step 1002). In other words, a match for the address from the request is found in the tag array, indicating that the data from the address is present in a corresponding portion of the cache.

The cache then checks a history record for the portion of the cache and determines that the history record indicates that a prior single-bit error was detected for the portion of the cache (step 1004). For example, in an embodiment where history records are two bits, the history record is acquired from the tag array and determined to be equal to a value such as 01 that indicates that there was a prior single-bit bit error detected for the portion of the cache.

Because there was a prior single-bit bit error detected for the portion of the cache, the cache is configured to use error correction as the error protection method for the portion of the cache. In other words, before using the data from the portion of the cache, the cache is configured to use an error correction code to detect and correct, if possible, bit errors in the data in the portion of the cache. As described above, in the examples herein, a single error correct double error detect, or SEC-DED, error correction code is used. Generally, the error correction codes are stored in allocated entries in an error correction code cache (e.g., error correction code cache 208). The cache therefore acquires, from an entry in the error correction code cache that is associated with the portion of the cache, a corresponding error correction code (step 1006). For example, the cache performs a tag lookup in a tag array in the error correction code cache using an address or other identifier for the portion, the data, etc. and, based on a hit in the tag array, acquires the error correction code from an error correction code array in the error correction code cache.

Upon checking the data in the portion of the cache using the error correction code, the cache detects an uncorrectable multi-bit bit error in the data (step 1008). For example, repeating and/or permanent errors such as errors caused by operating the cache at a reduced supply voltage may occur in the portion of the cache memory (i.e., in a corresponding memory element). Such errors can repeatedly and/or permanently occur in the same bit locations in the portion of the cache memory unless the supply voltage is increased. As another example, soft or transient errors may occur in the portion of the cache memory. The bit error is uncorrectable in that the error correction code is insufficient to correct a multi-bit error.

Because the multi-bit bit error is uncorrectable, the cache performs operations for preventing the portion of the cache from being used for storing data. More specifically, the cache sets the history record for the portion of the cache to indicate that the multi-bit bit error was detected (step 1010). The cache also disables the portion of the cache (step 1012). For example, in some embodiments, a replacement policy used by the cache is configured so that any portion of the cache with a history record that indicates a multi-bit bit error is not selected or otherwise allocated for storing data. In these embodiments, the portion of the cache is "disabled" by not being selected for storing data, although the corresponding memory circuits may remain electrically powered and available for other operations. As another example, in some embodiments, the cache sets a disabled bit in the corresponding location in the tag array so that no tag is permitted to be stored in the corresponding location in the tag array, sets a disabled bit in the portion of the cache, adds an identifier for the portion of the cache to a disabled list, and/or performs other operations to ensure that the portion of the cache is not subsequently used for storing data. By disabling the portion of the cache as described, the cache removes the portion of the cache, now known to include a multi-bit error that is undetectable/uncorrectable using the error correction code, from use within the cache. The cache further invalidates a corresponding error correction code in the error correction code cache (step 1014). This operation frees an entry that may have been occupied in the error correction code cache.

The cache then acquires the data from main memory or a lower cache (step 1016). For example, the cache signals a cache miss for the data (despite actually having the incorrect copy located in the portion of the cache), which causes the computing device to acquire the cache from the main memory or the lower level cache.

If necessary, the cache updates a corresponding error correction code in the error correction code cache (step 1018). For example, the cache selects a different portion of the cache to which the data is to be stored and updates the corresponding error correction code when the history record for the different portion indicates that a prior single-bit bit error was detected for the different portion. As described herein, this operation involves the cache generating an error correction code based on the data and storing the error correction code in the error correction code cache.

The cache then updates parity information for the different portion of the cache (step 1020). During this operation, the cache generates, based on the acquired data, parity information. For example, for the above-described segmented and interleaved parity, the cache generates parity bits for corresponding segments of the data. The cache then stores the parity information in the portion of the cache. For example, a number of parity bits is associated with the portion of the cache and the parity information is stored thereto. By updating the parity information for the portion of the cache as described, parity checks are enabled for the data in the portion of the cache.

The cache then stores the acquired data in the different portion of the cache (step 1022). Generally, the different portion of the cache is a portion of the cache other than the portion of the cache in which the multi-bit bit error was detected. For example, the different portion of the cache may be a different way in a set for an associative cache, etc. The cache next returns the acquired data in response to the request (step 1020).

During the process in FIG. 10, to summarize, a multi-bit bit error is presently detected in a portion of the cache memory in which a single-bit was previously detected using an error correction code. In response, the cache updates the history record to indicate that the multi-bit bit error was detected in the portion and removes the portion from use. Note that portions of the cache removed as described may subsequently be verified and returned to use, for example, if one or more bits of the multi-bit bit error were due to a transient error such as a soft error.

Loading Data for a Request that Misses in the Cache

Figure 11:
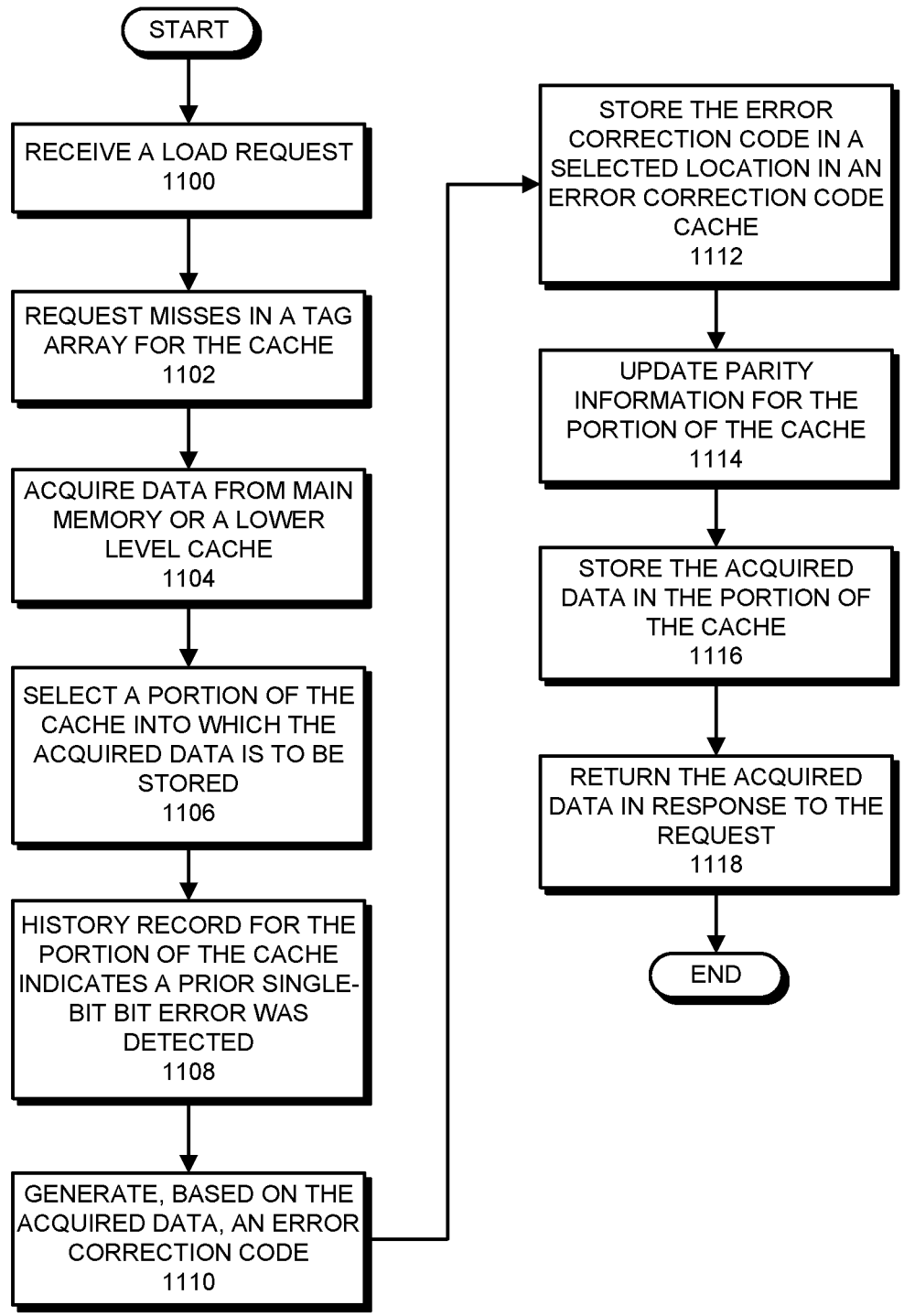
FIG. 11 presents a flowchart illustrating a process for servicing a load request that misses in the cache in accordance with some embodiments.

FIG. 11 presents a flowchart illustrating a process for servicing a load request that misses in the cache in accordance with some embodiments. Note that the operations shown in FIG. 11 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 11 starts when the cache (e.g., a cache controller 212 in the cache) receives, from a requesting entity (e.g., a core 102), a load request (step 1100). Using an address from the request, the cache checks a tag array to determine if the data is present in the cache. For the example in FIG. 11, it is assumed that the data is not present in the cache, so the request misses in the tag array (step 1102). In other words, a match for the address from the request is not found in the tag array, indicating that the data from the address is not present in the cache. For example, the data may earlier have been evicted.

The cache then acquires the data from main memory or a lower cache (step 1104). For example, the cache signals a cache miss for the data, which causes the computing device to acquire the data from the main memory or the lower level cache. The cache next selects a portion in the cache (i.e., in a data array in the cache) into which the acquired data is to be stored (step 1106). In some embodiments, when there is no free/available portion in the cache, existing data is chosen for eviction from a selected portion in accordance with a replacement policy to free space for storing the data. For example, a least recently used policy is the replacement policy.

The cache then checks a history record for the portion of the cache and determines that the history record indicates that a prior single-bit error was detected for the portion of the cache (step 1108). For example, in an embodiment where history records are two bits, the history record is acquired from the portion of the cache and determined to be equal to a value such as 01 that indicates that there was a prior single-bit bit error detected for the portion of the cache.

The cache next generates, based on the acquired data, an error correction code (step 1110). During this operation, an error correction code is generated in accordance with the requirements of the SEC-DED error correction. The cache next stores the generated error correction code in a selected location in the error correction code cache (step 1112). As described above, the entries in the error correction code cache are not permanently mapped to particular portions of the cache and so step 1112 includes selecting a location within the error correction code cache for storing the generated error correction code as well as writing the error correction code (and possibly metadata such as valid bits, etc.) to the selected location.

In some embodiments, when there is no free/available entry in the error correction code cache, an existing error correction code is chosen for eviction from a selected location in accordance with a replacement policy for the error correction code cache to free space for storing the generated error correction code. For example, a least recently used policy is the replacement policy. In some embodiments, when an existing error correction code is evicted as described, the data in a corresponding portion of the cache is also evicted (or otherwise invalidated). In other words, the data in the portion of the cache that is protected by the evicted error correction code is also evicted from the cache when the error correction code is evicted. This is done because the error correction code that protected the data in the corresponding portion of the cache has been evicted and therefore there is no protection for the data in the portion of the cache. In addition, evicting the data from the portion of the cache frees the portion of the cache to store other data.

The cache next updates parity information for the portion of the cache (step 1114). During this operation, the cache generates, based on the acquired data, parity information. For example, for the above-described segmented and interleaved parity, the cache generates parity bits for corresponding segments of the data. The cache then stores the parity information in the portion of the cache. For example, a number of parity bits is associated with the portion of the cache and the parity information is stored thereto.

The cache then stores the acquired data in the portion of the cache (step 1116). The data is stored in the portion despite there being a possibility of a permanent or repeating single-bit bit error that effects a bit in the portion of the cache. This is acceptable because the error correction code was previously generated and stored in the error correcting code cache for the data stored in the portion, meaning that a single-bit bit error can be corrected. Note, however, that the single-bit bit error may be temporary, such as when a soft error causes a one-time bit change in the portion of the cache. As described herein, when the single-bit bit error is discovered to have dissipated, the history record is updated and the error protection method for the portion of the cache is changed to a parity check. The cache next returns the acquired data in response to the request (step 1118).

During the process in FIG. 11, to summarize, a newly generated error correction code added to the error correction code cache as a corresponding acquired data is written into a portion of the cache that was previously detected to have a single-bit bit error. In this way, the cache prepares to use the SEC-DED error correction when the data in the portion is subsequently accessed.

Although an embodiment is described for FIG. 11 in which the history record indicates a single-bit bit error, an alternative possibility is that no prior bit error was detected in the portion of the cache. In this case, there is no need for an update of the error correction code cache and the acquired data is simply stored in the selected portion of the cache and returned in response to the request as in steps 1114-1116 (i.e., steps 1110-1112 are skipped). In this case, in some embodiments, replacement status information for an error correction code cache entry corresponding to the portion of the cache is updated.

Storing Data to a Portion of the Cache

Figure 12:
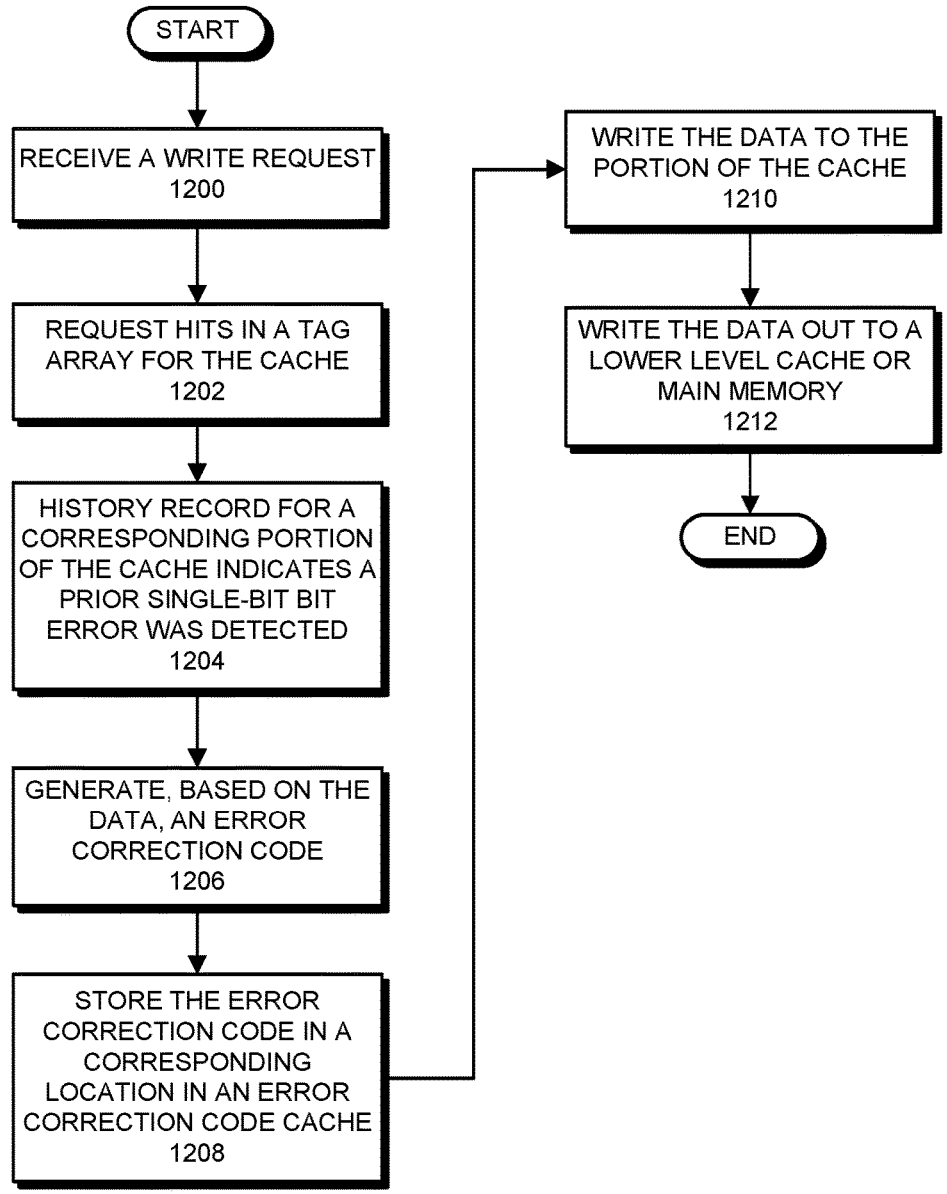
FIG. 12 presents a flowchart illustrating a process for storing data in a portion of the cache in accordance with some embodiments.

FIG. 12 presents a flowchart illustrating a process for storing data in a portion of the cache in accordance with some embodiments. Note that the operations shown in FIG. 12 are presented as a general example of functions performed by some embodiments. The operations performed by other embodiments include different operations and/or operations that are performed in a different order. Additionally, although certain mechanisms are used in describing the process, in some embodiments, other mechanisms can perform the operations.

The process shown in FIG. 12 starts when the cache (e.g., a cache controller 210 in the cache) receives, from a requesting entity (e.g., a core 102), a write request (step 1200). For example, the requesting entity may have modified the data during a computational operation and therefore needs to update data in a corresponding portion of the cache (and, more generally, memory) with the modified data. Using an address from the request, the cache checks a tag array to determine if the data (i.e., a copy of the data) is present in the cache. For the example in FIG. 12, it is assumed that the data is present in the cache, so the request hits in the tag array (step 1202). In other words, a match for the address from the request is found in the tag array, indicating that the data is present in a corresponding portion of the cache. If this was not the case, the cache line would be acquired from a lower level cache or main memory and the subsequent operations in FIG. 12 would be performed.

The cache then checks a history record for the portion of the cache and determines that the history record indicates that a prior single-bit error was detected for the portion of the cache (step 1204). For example, in an embodiment where history records are two bits, the history record is acquired from the portion of the cache and determined to be equal to a value such as 01 that indicates that there was a prior single-bit bit error detected for the portion of the cache.

The cache then generates, based on the data, an error correction code (step 1206). During this operation, an error correction code is generated in accordance with the requirements of the SEC-DED error correction. The cache next stores generated error correction code in a corresponding location in the error correction code cache (step 1208). The corresponding location in the error correction code cache is a location that was earlier selected for the error correction code as the data was initially added to the portion of the cache. In other words, the corresponding location in the error correction code cache was already associated with the portion.

The cache then writes the data to the data in the portion of the cache (step 1210). The data is written to in the portion despite there being a possibility of a permanent or repeating single-bit bit error that effects a bit in the portion of the cache. This is acceptable because the error correction code was previously generated and stored in the error correction code cache for the data stored in the portion based on the data, meaning that a single-bit bit error can be corrected.

The cache next writes the updated data out to memory (step 1212). As described herein, in the described embodiments, the cache is a write-through cache. In some embodiments, the cache is configured as write-through invalidate, which means that the data is invalidated in the cache following the write to main memory. This ensures that current and correct copies of data are held in memory (or at least in a lower level cache).

During the process in FIG. 12, to summarize, data is written to a portion of the cache, which may modify an existing value of the data. This could interfere with the use of an existing error correction code as the error protection method for the portion of the cache. To avoid errors, a new error correction code is generated based on the data and the old error correction code is overwritten/replaced in the error correction code cache. In this way, the cache prepares to use the SEC-DED error correction when the modified data in the portion is subsequently accessed.

Initialization

In some embodiments, as computing device 100 performs an initialization operation (e.g., at startup, when returning from sleep mode, when switching operating modes, etc.) the history records for all of the portions 204 in a cache (e.g., L1 cache 106, L2 cache 108, and/or L3 cache 110) are set to a value that indicates that a single-bit bit error was previously detected in the portion. For example, and continuing the example above, this means that the cache sets the history record to a value such as 01 that indicates that a single-bit bit error was detected in each portion. In this way, and using the herein described operations, the cache is configured so that each portion of the cache will be updated with an error correction code on usage and will be protected using the error correction code until the cache verifies (e.g., such as in FIG. 7) that there is actually no error in the corresponding portion.

History Record Verification and Update

As described above, in some embodiments, disabled portions can be re-enabled when it is determined that the multi-bit error was at least in part a transient soft error. More specifically, history records can be periodically checked and verified as listing the correct/present number of bit errors for the corresponding portion of the cache. This can mean that a history record that initially indicates that a corresponding portion has a multi-bit bit error can be checked (i.e., the portion can have one or more test values written to it and read back out) and updated to indicate less bit errors (including no bit errors, if multiple transient faults were previously detected). In these embodiments, the error protection method to be used is based on the history record, so various operations such as updating or invalidating error correction codes, etc. may be performed in addition to the verification.

Replacement Policy Metadata Updates

As described above, error correction codes in the error correction code cache are managed using a replacement policy. For example, the replacement policy may be a least recently used replacement policy under which a least recently used entry in the error correction code cache is preferentially evicted to free the entry for storing another error correction code. The same is true for the cache itself; a replacement policy is used to determine which portions of the cache are to have data evicted to free the portions to store other data. The cache may use the same general replacement policy as the error correction code cache or may not. In some embodiments, both the error correction code cache and the cache include replacement policy metadata, which is metadata that is used to determine, under the replacement policy, which entries or portions, respectively, are to be evicted.

In some embodiments, when replacement policy metadata is updated for a portion of the cache for which an error correction code is stored in a corresponding entry in the error correction code cache, the replacement policy metadata is also updated for the corresponding entry in the error correction code cache. For example, when portion of the cache is accessed, corresponding replacement policy metadata is updated in both the cache and the error correction code cache. In this way, replacement policy metadata is synchronized from the cache to the error correction code cache, which can help to avoid the case where an eviction in the error correction code cache causes an undesirable eviction of corresponding data from the cache.

In some embodiments, a computing device (e.g., computing device 100 in FIG. 1 and/or some portion thereof) uses code and/or data stored on a non-transitory computer-readable storage medium to perform some or all of the operations herein described. More specifically, the computing device reads the code and/or data from the computer-readable storage medium and executes the code and/or uses the data when performing the described operations.

A computer-readable storage medium can be any device or medium or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), caches/cache controllers, memory management units, compute units, embedded processors, graphics processors (GPUs)/graphics cores, pipelines, Accelerated Processing Units (APUs), cache controllers/caches, and/or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., computing device 100 and/or some portion thereof) is stored on a non-transitory computer-readable storage medium that includes a database or other data structure which can be read by a computing device and used, directly or indirectly, to fabricate hardware comprising the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, functional blocks may be referred to in describing some embodiments. Generally, functional blocks include one or more interrelated circuits that perform the described operations. In some embodiments, the circuits in a functional block include circuits that execute program code (e.g., microcode, firmware, applications, etc.) to perform the described operations.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A method for operating a cache memory in a computing device, the method comprising:
   storing, in a history record in an entry in a tag array of the cache memory that is associated with a portion of the cache memory, a representation of a number of bit errors detected in the portion of the cache memory during an access of the portion of the cache memory;
   when the history record indicates that no bit errors or a single-bit bit error was detected in the portion of the cache memory, selecting an error protection to be used for the portion of the cache memory during one or more subsequent accesses of the portion of the cache memory; and
   when the history record indicates that a multi-bit bit error was detected in the portion of the cache memory, disabling the portion of the cache memory.

2. The method of claim 1, wherein selecting the error protection comprises:
   selecting a parity check as the error protection when the history record indicates that no bit errors have been detected in the portion of the cache memory; and
   selecting an error correction as the error protection when the history record indicates that the single-bit bit error has been detected in the portion of the cache memory.

3. The method of claim 2, wherein, when the parity check is selected as the error protection:
   when accessing the portion of the cache memory to acquire data stored therein, performing the parity check, the performing comprising detecting bit errors in the portion of the cache memory; and
   maintaining the history record by:
   when a multi-bit bit error is detected, setting the history record to indicate that the multi-bit bit error was detected in the portion of the cache memory;

when a single-bit bit error is detected, setting the history record to indicate that a single-bit bit error was detected in the portion of the cache memory; and when no bit error is detected, leaving the history record indicating that no bit error was detected in the portion of the cache memory.

4. The method of claim 3, wherein, when the multi-bit bit error is detected:
acquiring the data from a main memory; and
storing the data acquired from the main memory in a different portion of the cache memory.

5. The method of claim 3, wherein, when the single-bit bit error is detected:
acquiring the data from a main memory;
generating an error correction code (ECC) for the data;
storing the ECC in a selected location in an error correction code cache; and
storing the data acquired from the main memory in the portion of the cache memory.

6. The method of claim 2, wherein, when error correction is selected as the error protection:
when accessing the portion of the cache memory to acquire data stored therein,
upon detecting no bit error in the portion of the cache memory using an error correction code (ECC), maintaining the history record by setting the history record to indicate that no bit error was detected in the portion of the cache memory; and
upon detecting at least one bit error in the portion of the cache memory using the ECC, attempting to correct the at least one bit error using the ECC; and
maintaining the history record by:
when the at least one bit error cannot be corrected using the ECC, setting the history record to indicate that the multi-bit bit error was detected in the portion of the cache memory; and
when the at least one bit error can be corrected using the ECC, leaving the history record indicating that the single-bit bit error was detected in the portion of the cache memory.

7. The method of claim 6, wherein using the ECC comprises:
acquiring, from an error correction code cache, the ECC, wherein the error correction code cache includes entries for storing ECCs for only a subset of the portions of the cache memory, and wherein the entries in the error correction code cache are configurably mapped to portions of the cache memory in which single-bit bit errors were detected.

8. The method of claim 7, further comprising:
evicting, from the error correction code cache, the ECC; and
based on the eviction from the error correction code cache of the given ECC, evicting, from the portion of the cache, the data.

9. The method of claim 7, further comprising:
upon updating replacement policy metadata for the portion of the cache when the history record indicates a single bit error was detected, updating replacement policy metadata for a corresponding entry in the error correction code cache.

10. The method of claim 1, wherein maintaining the history record comprises:
during an initialization, initializing the history record to indicate that the single-bit bit error was detected in the portion of the cache memory.

11. The method of claim 1, further comprising:
verifying the history record for the portion of the cache memory, the verifying comprising:
determining a number of bit errors in the portion of the cache memory; and
when the number of bit errors is different than the number of bit errors indicated in the history record, updating, based on the number of bit errors, some or all of the history record for the portion of the cache memory and an error correction code (ECC) in an error correction code cache.

12. A computing device, comprising:
one or more processing cores; and
a cache that includes a tag array having a number of entries, each entry in the tag array including a history record, the cache configured to:
store, in a history record in an entry in the tag array that is associated with a portion of the cache memory, a representation of a number of bit errors detected in the portion of the cache memory during an access of the portion of the cache memory;
when the history record indicates that no bit errors or a single-bit bit error was detected in the portion of the cache memory, select an error protection to be used for the portion of the cache memory during one or more subsequent accesses of the portion of the cache memory; and
when the history record indicates that a multi-bit bit error was detected in the portion of the cache memory, disable the portion of the cache memory.

13. The computing device of claim 12, wherein, when selecting the error protection, the cache is configured to:
select a parity check as the error protection when the history record indicates that no bit errors have been detected in the portion of the cache memory; and
select an error correction as the error protection when the history record indicates that the single-bit bit error has been detected in the portion of the cache memory.

14. The computing device of claim 13, wherein, when the parity check is selected as the error protection, the cache is configured to:
when accessing the portion of the cache memory to acquire data stored therein, perform the parity check, the performing comprising detecting bit errors in the portion of the cache memory; and
maintaining the history record by:
when a multi-bit bit error is detected, set the history record to indicate that the multi-bit bit error was detected in the portion of the cache memory;
when a single-bit bit error is detected, set the history record to indicate that a single-bit bit error was detected in the portion of the cache memory; and
when no bit error is detected, leave the history record indicating that no bit error was detected in the portion of the cache memory.

15. The computing device of claim 14, wherein, when the multi-bit bit error is detected, the cache is further configured to:
acquire the data from a main memory; and
store the data acquired from the main memory in a different portion of the cache memory.

16. The computing device of claim 14, wherein, when the single-bit bit error is detected, the cache is further configured to:
acquire the data from a main memory;
generate an error correction code (ECC) for the data;
store the ECC in a selected location in an error correction code cache; and store the data acquired from the main memory in the portion of the cache memory.

17. The computing device of claim 13, wherein, when error correction is selected as the error protection, the cache is configured to:
  when accessing the portion of the cache memory to acquire data stored therein,
    upon detecting no bit error in the portion of the cache memory using an error correction code (ECC), maintain the history record by setting the history record to indicate that no bit error was detected in the portion of the cache memory; and
    upon detecting at least one bit error in the portion of the cache memory using the ECC, attempt to correct the at least one bit error using the ECC; and
    maintain the history record by:
      when the at least one bit error cannot be corrected using the ECC, setting the history record to indicate that the multi-bit bit error was detected in the portion of the cache memory; and
      when the at least one bit error can be corrected using the ECC, leaving the history record indicating that the single-bit bit error was detected in the portion of the cache memory.

18. The computing device of claim 17, wherein, when using the ECC, the cache is configured to:
  acquire, from an error correction code cache, the ECC, wherein the error correction code cache includes entries for storing ECCs for only a subset of the portions of the cache memory, and wherein the entries in the error correction code cache are configurably mapped to portions of the cache memory in which single bit errors were detected.

19. The computing device of claim 12, wherein, when maintaining the history record, the cache is configured to:
  during an initialization, initialize the history record to indicate that the single-bit bit error was detected in the portion of the cache memory.

20. The computing device of claim 12, wherein the cache is further configured to:
  verify the history record for the portion of the cache memory, the verifying comprising:
    determining a number of bit errors in the portion of the cache memory; and
    when the number of bit errors is different than the number of bit errors indicated in the history record, updating, based on the number of bit errors, some or all of the history record for the portion of the cache memory and an error correction code (ECC) in an error correction code cache.

* * * * *